United States Patent [19]

Sullivan et al.

[11] Patent Number: 5,743,750

[45] Date of Patent: Apr. 28, 1998

[54] ELECTRICAL CONNECTOR FOR STRAIGHT-THROUGH CONNECTION AND BREAKOUT TESTING OF DATA COMMUNICATION LINES

[75] Inventors: Robert W. Sullivan, Simi Valley; Lee A. Watkins, Thousand Oaks, both of Calif.

[73] Assignee: Test-Um, Inc., Camarillo, Calif.

[21] Appl. No.: 699,662

[22] Filed: Aug. 19, 1996

[51] Int. Cl.[6] .................................................. H04M 1/24
[52] U.S. Cl. ........................ 439/76.1; 379/21; 439/912; 439/941
[58] Field of Search ........................ 439/76.1, 676, 439/638, 941, 912; 379/21, 26, 27, 29, 30, 31

[56] References Cited

U.S. PATENT DOCUMENTS

| | | | |
|---|---|---|---|
| 5,269,708 | 12/1993 | De Young et al. | 439/676 |
| 5,391,095 | 2/1995 | Bom | 439/676 |
| 5,440,609 | 8/1995 | Curtis | 379/21 |
| 5,618,185 | 4/1997 | Aekins | 439/76.1 |

*Primary Examiner*—Neil Abrams
*Attorney, Agent, or Firm*—Gene W. Arant; Christopher R. Balzan

[57] ABSTRACT

An electrical connector utilizing a circuit board assembly for providing straight-through electrical interconnection of data line pairs between two jacks, and for providing breakout terminals. The layout of the electrical connector is such that common mode rejection is improved and cross-talk between data line pairs is minimized. The electrical connector has a circuit board with conductors located on both the bottom and top surfaces of the circuit board. The conductors are serially coupled to test pads to form a straight-through connection between pin openings located at opposite ends of the circuit board. The test pads are located so that the pads representing data line pairs are adjacent one another. Location of the test pads allows the conductors representing data line pairs to be located in a close parallel relationship for at least part of the way along the circuit board. The layout is such that most of the over-crossings of non-paired data line conductors on opposite sides of the circuit board are made at approximately right angles.

16 Claims, 5 Drawing Sheets

5,743,750

ELECTRICAL CONNECTOR FOR STRAIGHT-THROUGH CONNECTION AND BREAKOUT TESTING OF DATA COMMUNICATION LINES

FIELD OF THE INVENTION

This invention relates to electrical connectors, particularly for use in data circuits.

BACKGROUND OF THE INVENTION

Electrical connectors for data circuits typically have a standard female communication jack at each end, and internal circuitry connecting the pins or terminals of the two jacks.

A "straight-through connection" of the conductors inside the connector causes pin 1 of one jack to be electrically connected to pin 1 of the other jack, and so on. However, because the jacks are identical and are inserted from opposite ends of the connector, the No. 1 pin of each jack is in a position laterally opposite to the No. 1 pin of the other jack, rather than directly across from it. In order to connect No. 1 to No. 1, it is therefore necessary for conductors inside the connector to cross paths, thus raising a risk of cross-talk between circuit pairs.

High fidelity operation of data circuits is imperative in order to avoid error and the loss of information. Cross-talk between wire pairs forming separate circuits is a general problem, and connectors are not exempt from that problem.

SUMMARY OF THE PRESENT INVENTION

In accordance with the present invention each two conductors inside the electrical connector that represent a particular circuit pair are kept close together in a close parallel relationship. Furthermore, conductors are placed on opposite surfaces of a circuit board, and wherever conductor cross-over is required, the conductors are so arranged that a conductor on one surface crosses over the location of a conductor on the opposite surface, but the two conductors at the point of cross-over are approximately at right angles to each other. In this manner, common mode rejection is improved, and the cross-talk between circuit pairs that contain the cross-over conductors is minimized.

Furthermore, the electrical connector provided by the present invention is adapted for breakout testing. Metal test pads are provided in a separate row which extends along each respective longitudinal edge of the circuit board. Each of the test pads interconnects two separate conductors that in turn interconnect the corresponding pins of the two jacks. This arrangement allows breakout testing to be done without interrupting the cable service.

DETAILED DESCRIPTION OF PREFERRED EMBODIMENT (FIGS. 1–6)

Figure 1:
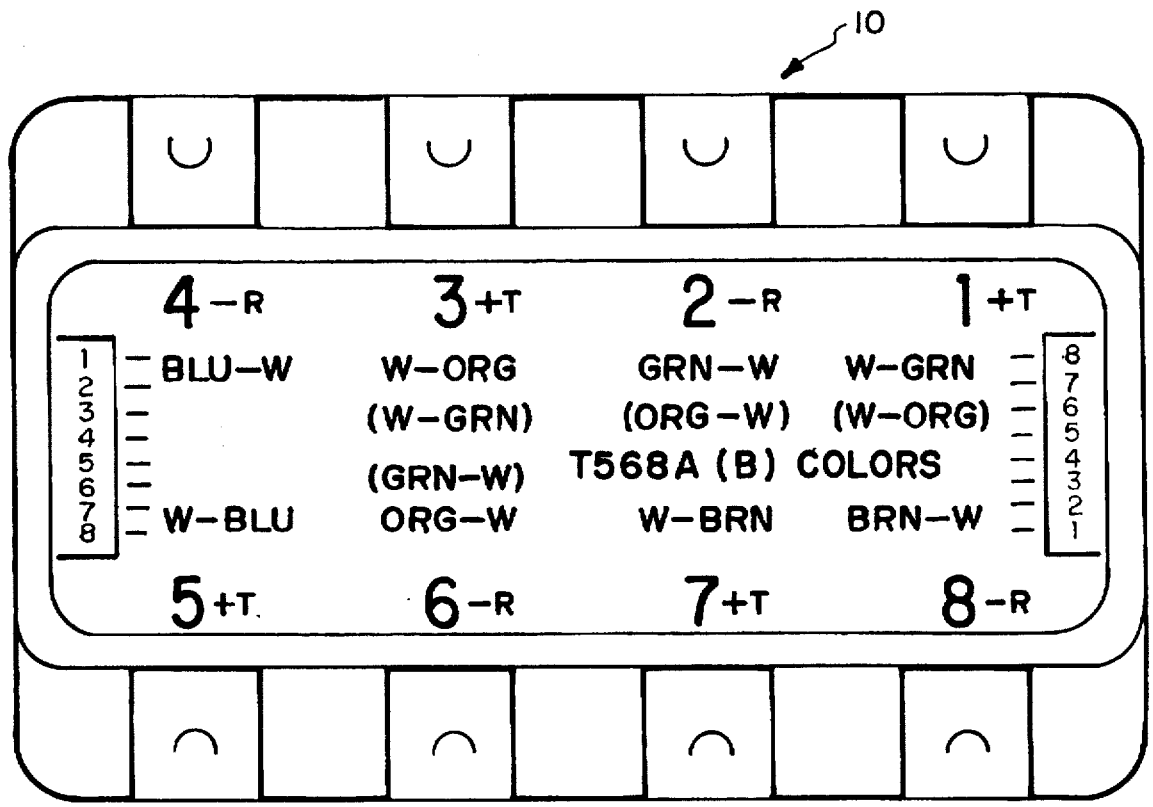
FIG. 1 is a top plan view of the preferred form of the connector of the present invention.
Figure 2:
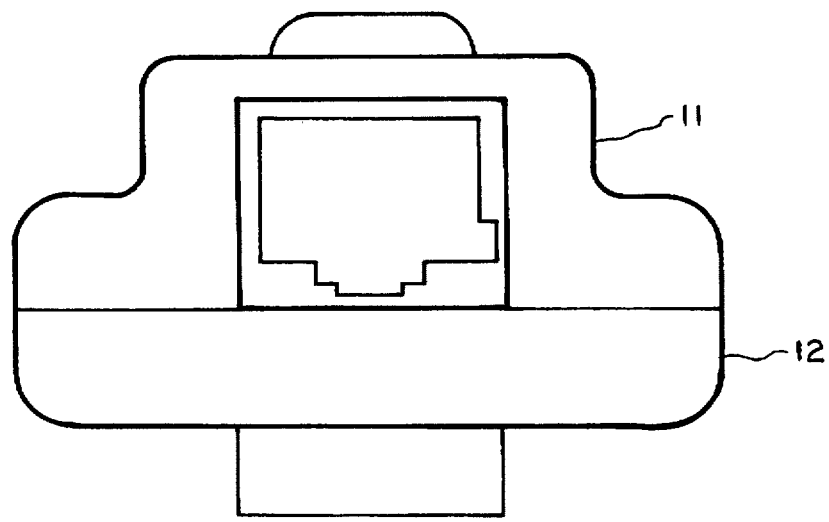
FIG. 2 is an end elevation view showing the upper and lower housing members and location of a female jack therein.

An electrical connector 10 has an elongated generally rectangular housing formed of upper plastic housing member 11 and lower plastic housing member 12, which are adapted to interfit in a closed relationship except for specific openings therein. A flat circuit board 20 is supported in sandwich fashion between the upper and lower housing members. Circuit board has an end 21 appearing at the right hand side of FIG. 3, and end 22 at the left side. As will later be described, the top surface of the circuit board is designated as 23 and its bottom surface as 24.

Figure 3:
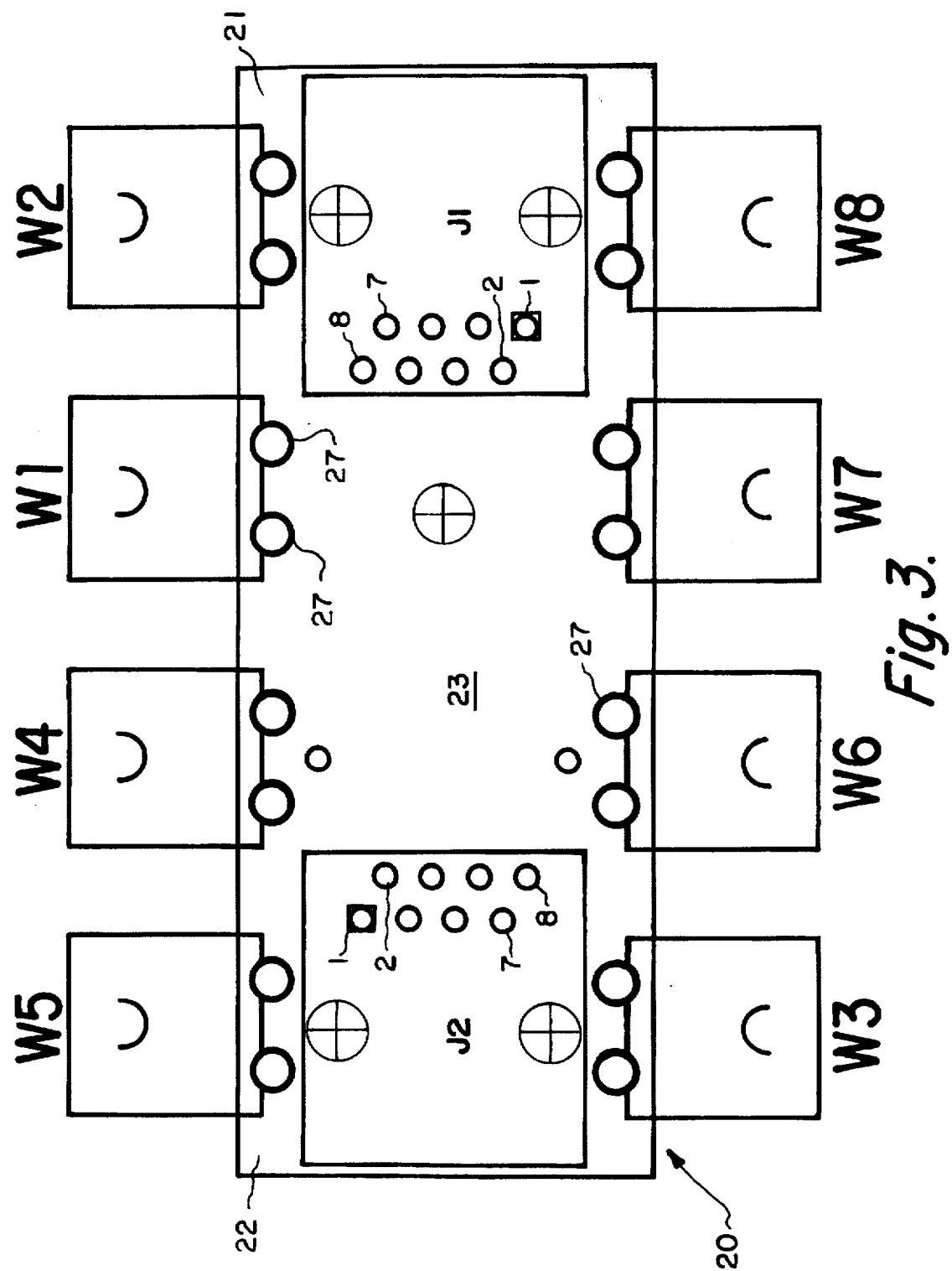
FIG. 3 is a top plan view of the circuit board and test pads, and showing the two jack locations.
Figure 4:
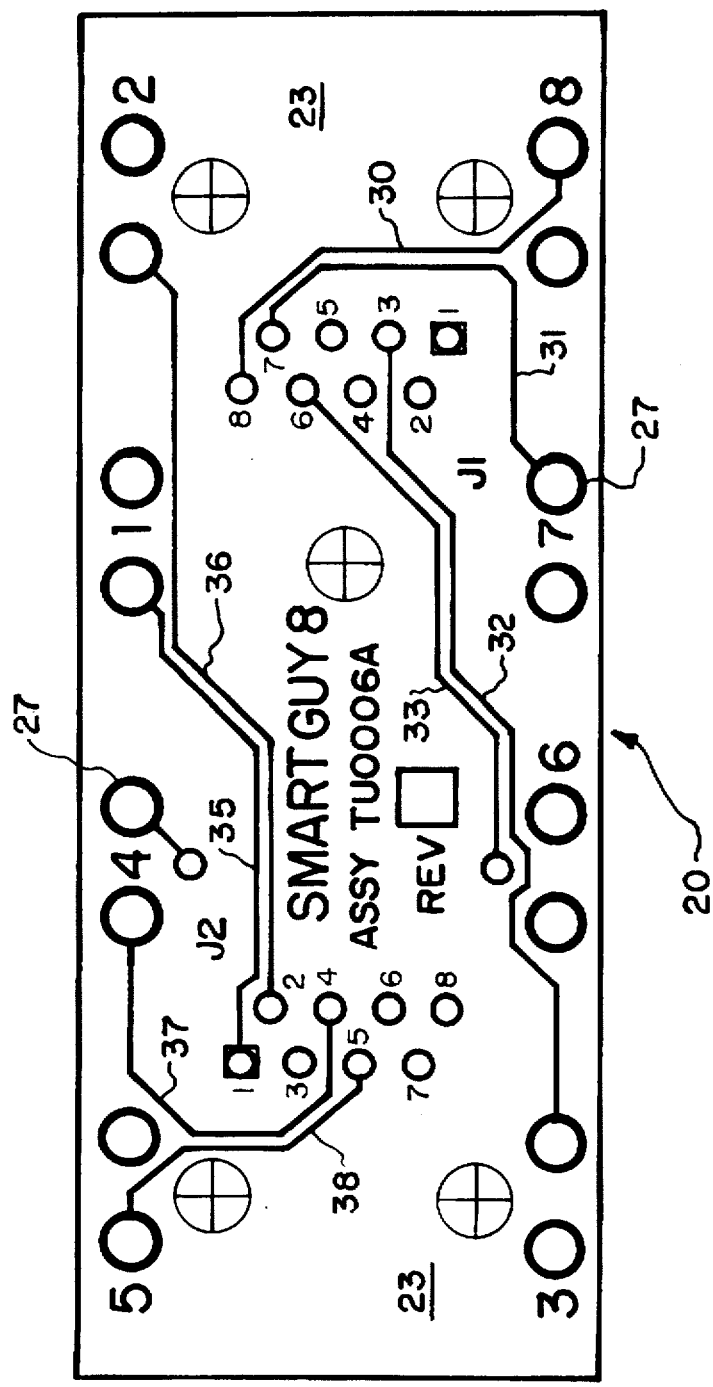
FIG. 4 is wiring diagram of the top surface of the circuit board.
Figure 5:
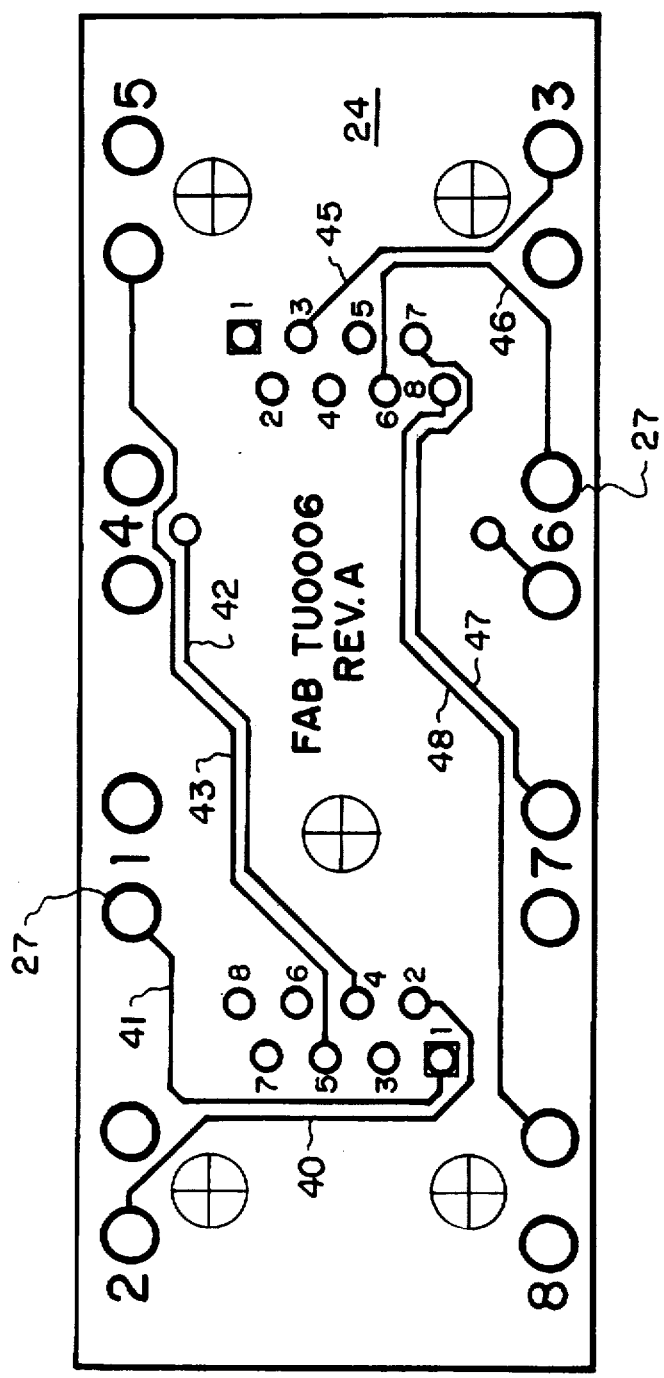
FIG. 5 is a wiring diagram of the bottom of the circuit board as seen from above through the top surface.
Figure 6:
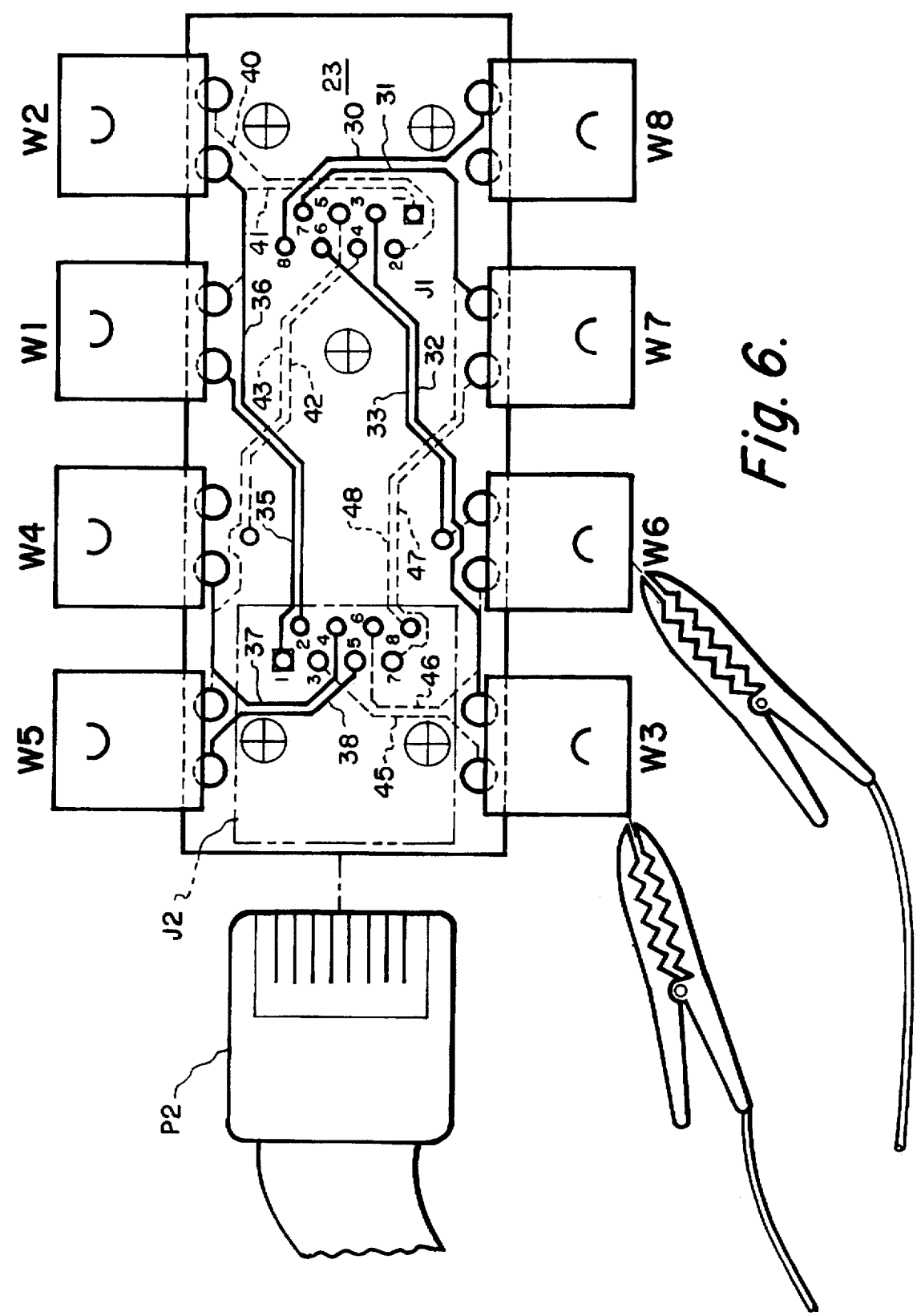
FIG. 6 is a wiring diagram of the top surface of the circuit board and shows the location of: test pads; conductors on the under surface of the circuit board; and the location of one of two female jacks.

Female communication jacks J1, J2 are received in respective ends of the housing. Jack J1 is received at end right end 21 of the circuit board, and jack J2 at left end 22. The jacks J1, J2 are type RJ 45, each including eight pins having eight positions. The pins of each jack form two rows extending laterally of the housing. FIG. 3 not only shows the location of the jacks J1 and J2, but also schematically shows the locations of the two rows of pin openings adjacent each end of the circuit board and extending transversely thereon. One row has four pin openings for receiving output pins 1, 3, 5, 7 of the corresponding jack, and the other row has four pin openings for receiving output pins 2, 4, 6, 8 of the same jack. The pin locations are also shown in FIGS. 3 and 4, which illustrate only the circuit board 20 and its various accessories.

The square terminal or pin opening for each jack J1 or J2 represents pin No. 1. The No. 1 pin at one end of the circuit board is on one laterally extending edge thereof, and the No. 1 pin at the other end of the housing is on the opposite lateral edge. Thus, it will be seen that corresponding terminals on the two jacks are on opposite lateral sides of the circuit board. Nevertheless, it is desired that electrical conductors inside the housing on the circuit board interconnect the respective pins of the jacks in a straight-through 8-wire connection pattern.

The invention in its preferred form provides for breakout testing of the circuits carried by the connector. Four metal test pads are provided in a separate row which extends along each respective longitudinal edge of the circuit board. Test pads W2, W1, W4, and W5, appearing in that sequence from right end 21 of the circuit board, are on one longitudinal edge of the circuit board. Test pads W8, W7, W6, and W3, appearing in that sequence also from right end 21, are on the other longitudinal edge of the circuit board. Four pairs of eyelets 27 are formed on each longitudinal edge of the circuit board, and a corresponding metal test pad interconnects the two eyelets of each pair. Each test pad interconnects two respective separate conductors that are in turn interconnected between the eyelets and the corresponding pins of the two jacks. This arrangement allows breakout testing to be done without interrupting the cable service.

To accomplish this, some of the conductors are on the upper surface of the circuit board and the others of the conductors are on the bottom surface of the circuit board. The eyelets 27 formed through the circuit board 20 permit interconnection of conductors that are on the opposite surfaces of the board. The conductors themselves are identified generally by numerals 30–33, 35–38, 40–43, and 45–48.

According to the invention, conductors on one surface of the circuit board connect one pin opening for each wire pair of one of the jacks to a test pad on one longitudinal edge of the circuit board, while conductors on the opposite surface connect one pin opening for each of the other wire pairs of the same jack to a test pad on the other longitudinal edge of the circuit board. These four sets of conductors fully interconnect Pin 1 of the jack at one end of the connector with Pin 1 of the other jack, Pin 8 with Pin 8, and so on, and at the same time provide for breakout testing without interrupting the cable operation.

More specifically, a first set of four conductors 30–33 on the upper surface 23 of circuit board 20 connects half of the pin openings on right end 21 of the board corresponding to Jack J1, to half of the eyelet pairs on one longitudinal edge of the board, corresponding to test locations 8, 7, 6, and 3. A second set of four conductors 35–38 on the upper surface 23 of circuit board 20 connects half of the pin openings on the left end 22 of board 20 to half of the eyelet pairs on the other longitudinal edge of the board, which correspond to test locations 2, 1, 4, and 5. A third set of four conductors 40–43 is on the under surface 24 of circuit board 20 and connects the other half of the pin openings on right end 21 of the circuit board to the other half of the eyelets on the other longitudinal edge of the board, which correspond to test locations 2, 1, 4, and 5. A fourth set of four conductors 45–48 on the bottom surface 24 of circuit board 20 connect the other half of the pin openings on the other end 22 of board 20 to the other half of the eyelets on the other longitudinal edge of the board, which correspond to test locations 8, 7, 6, and 3.

Corresponding pins at the two ends of the housing are connected by the conductors 30–48 to opposite edges of a corresponding test pad. Thus, the square Pin 1 of Jack J1 is connected to a conductor 41 on the under surface of circuit board 20, and that conductor 41 in turn is connected to one eyelet of eyelet pair 1 on the circuit board. On the upper surface of the circuit board, the other eyelet of eyelet pair 1 is connected through a conductor 35 to the square pin of J2. The two eyelets of eyelet pair 1 are connected to respective edges of test pad W1.

The arrangement of the conductors is also such that no two conductors cross over each other on the top side of the circuit board, and no two conductors cross over each other on the bottom side of said circuit board. Wherever possible the two conductors that represent a particular circuit pair are kept close together in a parallel relationship. Thus the conductors for pin pair 1–2 are kept in close parallel relation on both the top and bottom surfaces of the circuit board 20.

To the extent possible, wherever a conductor on one surface of the circuit board crosses over the location of a conductor on the opposite surface of the circuit board, the over-crossing is made at approximately a right angle. This feature is very important for minimizing cross-talk between circuits within the connector.

As a result of the foregoing principles of arrangement, the test pads of one row on one longitudinal edge of circuit board 20 are connected to pin openings or terminals 2, 1, 4, and 5 for both jacks; and the test pads of the other row are connected to pin openings or terminals 8, 7, 6, and 3 for both jacks.

It is important to note that in the presently conventional data cable, wire pairs are twisted together in the following pattern; wires 1 and 2 are a pair; wires 7 and 8 are a pair; wires 3 and 6 are a pair; and wires 4 and 5 are a pair. The present invention preserves that pairing in a conveniently accessible arrangement so that a person testing the cable will always find the two test pads for a particular wire pair immediately next to each other. At the same time, the pairs of the conductors on the circuit board 20 are kept in close parallel relationship so as to simulate as well as can be done with a circuit board, the twisted pair relationship that exists in the associated cables.

The presently preferred form of the invention has been disclosed in detail in order to comply with the patent laws. However, the scope of the invention is to be judged only in accordance with the appended claims.

What we claim is:

1. A circuit board assembly for use in an electrical connector to provide straight-through interconnection of data lines between two jacks each of which has eight output pins, said circuit board assembly comprising:

a circuit board (20) having two ends (21, 22), a top surface (23) and a bottom surface (24);

two rows of pin openings adjacent each end of said board and extending transversely thereon, one row having four pin openings for receiving the output pins (1, 3, 5, 7) of a corresponding jack, and the other row having four pin openings for receiving the output pins (2, 4, 6, 8) of the corresponding jack;

four pairs of eyelets (27) forming a row on each longitudinal edge of said circuit board;

four sets of conductors on said circuit board, having four conductors in each set, a first set (30–33) being on the top surface (23) of said circuit board (20) and connecting half of said pin openings on one end (21) of said board to half of said eyelets on one longitudinal edge of said board, a second set (35–38) being on the top surface (23) of said circuit board (20) and connecting half of said pin openings on the other end (22) of said board to half of said eyelets on the other longitudinal edge of said board, a third set (40–43) being on the bottom surface (24) of said circuit board (20) and connecting the other half of said pin openings on said one end (21) of said board to the other half of said eyelets on the other longitudinal edge of said board, and a fourth set (45–48) being on the bottom surface (24) of said circuit board and connecting the other half of said pin openings on the other end (22) of said board to the other half of said eyelets on said one longitudinal edge of said board;

a separate row of four metal test pads extending along each respective side of said circuit board to form breakout terminals, each of said test pads being connected between an associated pair of eyelets and serving to thereby interconnect corresponding pin openings at the two ends of said circuit board; and the first two test pads in one row representing pin opening pair (1 and 2), the second two test pads in said one row representing pin opening pair (4 and 5), the first two test pads in the other row representing pin opening pair (7 and 8), and the second two test pads in said other row representing pin opening pair (3 and 6); and the arrangement of said conductors further being such that:

(1) said conductors for each pin opening pair are in close parallel relation; and (2) at each over-crossing where a conductor on one surface of said circuit board crosses over the location of a conductor on the opposite surface of said circuit board, said over-crossing is made at approximately a right angle, said arrangement of said conductors thereby maximizing common mode rejection and minimizing cross-talk between the circuit pairs within said connector.

2. In an electrical connector having jacks at its two ends and an internal circuit board having conductors thereon for providing straight-through interconnection of data lines between the jacks, and further characterized in that corresponding terminals on the two jacks are on opposite ends of the circuit board, the improvement comprising:

the circuit board having top and bottom surfaces, some of the conductors being on the top surface of said circuit board and the others of the conductors being on the bottom surface thereof;

the arrangement of said conductors being such that at most of the over-crossings where a conductor on one surface of said circuit board crosses over the location of a conductor on the opposite surface of said circuit board, said over-crossing is made at approximately a right angle, thereby minimizing cross-talk between the circuits within said connector;

a separate row of metal test pads extending along each longitudinal edge of said circuit board to form breakout terminals; and said conductors that interconnect corresponding terminals on said two jacks being connected to opposite edges of a corresponding one of said test pads.

3. An electrical connector as in claim 2 wherein the arrangement of said conductors is such that each two conductors that represent a particular circuit pair are kept in a close parallel relationship; each of said jacks has eight terminals; and said test pads are paired 1–2, 4–5, 3–6, and 7–8.

4. An electrical connector for providing straight-through connection of data lines, comprising:

an elongated generally rectangular housing;

said housing having two ends with respective openings therein receiving 8-pin 8-conductor female communication jacks, the pins of each jack forming two rows extending laterally of said housing, the No. 1 pin at one end of said housing being on one lateral side thereof and the No. 1 pin at the other end of said housing being on the opposite lateral side thereof;

a circuit board within said housing having top and bottom surfaces, and having electrical conductors on both said top and bottom surfaces thereof interconnecting the respective pins of said jacks in a straight-through 8-wire connection pattern;

the arrangement of said conductors being such that each two conductors that represent a particular circuit pair are kept in a close parallel relationship, and wherever a conductor on one surface of said circuit board crosses over the location of a conductor on the opposite surface, most of said over-crossings are made at approximately a right angle, thus improving common mode rejection and minimizing cross-talk between circuits within said connector;

four metal test pads forming breakout terminals extending in a row along each respective longitudinal edge of said circuit board; and corresponding pins at the two ends of said housing being connected by said conductors to opposite edges of a corresponding one of said test pads.

5. An electrical connector providing straight-through electrical interconnection of data line pairs between two jacks comprising:

a) a circuit board having top and bottom surfaces, two ends, and two sides;

b) the circuit board having pin openings near each end of the circuit board, the pin openings at each end being capable of receiving pins forming a corresponding jack;

c) test pads located along each side of the circuit board;

d) conductors arranged on both the bottom and top surfaces of the circuit board;

e) the conductors being coupled to the test pads to form a straight-through connection between corresponding pin openings located at opposite ends of the circuit board; and f) each test pad being in series with its associated conductors.

6. The electrical connector of claim 5 wherein the test pads are located along the sides of the circuit board such that pads representing wire pairs are adjacent one another.

7. The electrical connector of claim 6 wherein the conductors that form the circuit connection between the pin openings are located on one surface of the circuit board when connected to the pin opening near one end of the circuit board, and are located on the opposite surface of the circuit board when connected to the pin opening near the other end of the circuit board which completes the straight-through connection.

8. The electrical connector of claim 7 wherein the conductors representing wire pairs are located in a close parallel relationship for at least part of the way along the circuit board.

9. The electrical connector of claim 8 wherein the arrangement of the conductors is such that when a conductor on one side of the circuit board crosses over the location of a conductor on the opposite side of the circuit board, most of the over-crossings of conductors of non-paired data lines are made at approximately a right angle, thereby minimizing cross-talk between the circuits within the connector.

10. An electrical connector providing straight-through electrical interconnection of data line pairs between two jacks comprising:

a) a circuit board having top and bottom surfaces, two ends, and two sides;

b) the circuit board having pin openings near each end of the circuit board, the pin openings being capable of receiving pins for forming jacks;

c) test pads located along each side of the circuit board;

d) conductors arranged on both the bottom and top surfaces of the circuit board;

e) the conductors being coupled to the test pads to form a straight-through connection between corresponding pin openings located at opposite ends of the circuit board;

f) each test pad being in series with its associated conductor; and g) the test pads being located so that the pads representing wire pairs are adjacent one another, thereby allowing the conductors representing wire pairs to be located in a close parallel relationship for at least part of the way along the circuit board.

11. The electrical connector of claim 10 wherein the conductors that form the circuit connection between the pin openings are located on one surface of the circuit board when connected to the pin opening near one end of the circuit board, and are located on the opposite surface of the circuit board when connected to the pin opening near the other end of the circuit board which completes the straight-through connection.

12. The electrical connector of claim 11 wherein the arrangement of the conductors is such that when a conductor on one side of the circuit board crosses over the location of a conductor on the opposite side of the circuit board, most of the over-crossings of the conductors of non-paired data lines are made at approximately a right angle, thereby minimizing cross-talk between the circuits within the connector.

13. A circuit board for an electrical connector providing straight-through electrical interconnection of data line pairs comprising:
   a) a circuit board having top and bottom surfaces, two ends, and two sides;
   b) the circuit board having pin openings located at opposite ends of the circuit board, the pin openings being used to couple data lines to the circuit board;
   c) conductors located on both the bottom and top surfaces of the circuit board for coupling pin openings at opposite ends of the circuit board;
   d) test pads attached to the circuit board;
   e) the conductors being serially coupled to the test pads so as to form a straight-through circuit connection between corresponding pin openings; and
   f) the test pads being arranged on the circuit board so that the pads representing data line pairs are adjacent one another, the location of the test pads thereby allowing the conductors representing data line pairs to be located in a close parallel relationship for at least part of the way along the circuit board so as to improve common mode rejection.

14. The electrical connector of claim 13 wherein the conductors that form the circuit connection between the pin openings are located on one surface of the circuit board when connected to the pin opening near one end of the circuit board, and are located on the opposite surface of the circuit board when connected to the pin opening near the other end of the circuit board which completes the straight-through connection.

15. The electrical connector of claim 14 wherein the arrangement of the conductors is such that when a conductor on one side of the circuit board crosses over the location of a conductor on the opposite side of the circuit board, most of the over-crossings of the conductors of non-paired data lines are made at approximately a right angle, thereby minimizing cross-talk between the circuits within the connector.

16. The electrical connector of claim 15 further comprising data pins connected to the pin openings, the pins being housed in a modular jack, the jack being used for interconnection of data lines to the straight-through electrical connector.

* * * * *